(12) United States Patent
Takafuji (10) Patent No.: US 6,624,500 B2
(45) Date of Patent: Sep. 23, 2003

(54) THIN-FILM ELECTRONIC COMPONENT AND MOTHERBOARD

(75) Inventor: Junya Takafuji, Omihachiman (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/998,924

(22) Filed: Nov. 29, 2001

(65) Prior Publication Data

US 2002/0070423 A1 Jun. 13, 2002

(30) Foreign Application Priority Data

Nov. 30, 2000 (JP) ..................... P2000-364770

(51) Int. Cl.[7] .............................................. H01L 29/00
(52) U.S. Cl. ..................... 257/532; 257/535; 257/774; 257/776
(58) Field of Search ................. 257/532, 535, 257/774, 776

(56) References Cited

U.S. PATENT DOCUMENTS

| | | | |
|---|---|---|---|
| 4,439,813 A | | 3/1984 | Dougherty et al. |
| 4,800,459 A | * | 1/1989 | Takagi et al. ............... 361/321 |
| 5,177,670 A | * | 1/1993 | Shinohara et al. .......... 361/388 |
| 5,841,190 A | * | 11/1998 | Noda et al. ................. 257/678 |
| 5,900,643 A | * | 5/1999 | Preslar et al. ................ 257/48 |
| 5,993,946 A | * | 11/1999 | Inoue .......................... 428/210 |
| 6,178,082 B1 | * | 1/2001 | Farooq et al. ............... 361/303 |
| 6,278,172 B1 | * | 8/2001 | Tominaga .................... 257/535 |

FOREIGN PATENT DOCUMENTS

| | | | |
|---|---|---|---|
| JP | 2-281650 | * | 11/1990 |
| JP | 7-57967 | * | 3/1995 |
| JP | 8-250659 | * | 9/1996 |
| JP | 11-111561 | * | 4/1999 |
| JP | 2000-306951 | * | 11/2000 |
| JP | 2001-284482 | * | 10/2001 |

* cited by examiner

Primary Examiner—Nathan J. Flynn
Assistant Examiner—Ahmed N. Sefer
(74) Attorney, Agent, or Firm—Hogan & Hartson, LLP (57) ABSTRACT

An object of the invention is to provide a thin-film electronic component and a motherboard in which coupling strength of an external terminal to a supporting substrate is improved. The thin-film electronic component comprising: a supporting substrate; a lower electrode formed on part of the supporting substrate; an insulation layer formed on the lower electrode; an upper electrode formed on the insulation layer; a connection electrode which is formed on part of the supporting substrate located on a bottom surface of a through hole formed on the insulation layer, and is electrically connected to the lower electrode; and an external terminal disposed on the connection electrode within the through hole.

7 Claims, 4 Drawing Sheets

THIN-FILM ELECTRONIC COMPONENT AND MOTHERBOARD

BACKGROUND OF THE INVENTION

1. Field of the Invention

The present invention relates to a thin-film electronic component and a motherboard, and more particularly to a thin-film electronic component and a motherboard, which are operated at high frequencies, suitably used for a thin-film capacitor, a thin-film inductor, a thin-film LC filter, a thin-film resistance, a thin-film RC filter, or the like.

2. Description of the Related Art

Accompanying the recent trend toward realizing electronic equipment in small sizes yet maintaining highly sophisticated functions, it has been strongly urged to provide electronic components having small size and slimness so that they can be installed in the electronic equipment to satisfy the demand for high-frequency use.

In a high-speed digital circuit of a computer that must process large quantity of data at high speeds, in particular, the clock frequency in a CPU chip is as high as from 200 MHz to 1 GHz, and the clock frequency of a bus among the chips is also as high as from 75 MHz to 133 MHz even on a level of a personal computer.

As the degree of integration of LSI increases and a larger and larger number of elements are provided in the chip, the power source voltage tends to be lowered to suppress electric power consumption. Accompanying an increase in the operation speed, an increase in the density, and a decrease in the voltage in the IC circuits, passive parts such as capacitors must also be designed in small sizes yet having large capacities to exhibit excellent characteristics for high-frequency pulses or high-speed pulses.

As the operation frequency increases, resistance and inductance possessed by the element cause an instantaneous drop in the power-source voltage on the side of the logic circuit, or new voltage noise. As a result, an error occurs on the logic circuit. In modern LSIs, in particular, the power source voltage has been lowered to suppress an increase in the consumption of electric power that results from an increase in the total number of elements, and the width of permissible change in the power source voltage has been decreased. During coming years, it is expected that there will be further increase in the number of elements and increase in the operation frequency, and consequently a reduction in resistance and inductance components on the mount portion will be of particular importance in connection with logic circuit errors.

As a natural consequence of such a trend, not only an improvement in the electrical characteristics of the passive element itself, but also mounting-related characteristics (mounting accuracy and mounting reliability) of higher level have been sought after. For example, higher mounting accuracy is required to cope with an increase in the number of the elements, and satisfactory reflow resistance is required for mounting components properly.

As a method for decreasing inductance in a connection portion of a capacitor, a thin-film capacitor is disclosed in U.S. Pat. No. 4,439,813. In this conventional thin film capacitor, to obtain electric signals fed from a lower electrode made of TiW, Ta, Al, and Cu in the shortest distance, a through hole is formed in an insulation layer, an upper electrode, and a protective layer, and, after forming a BLM layer made of Cr/Cu/Au on the inner wall of the through hole, a solder bump is formed on this BLM layer.

Figure 6:
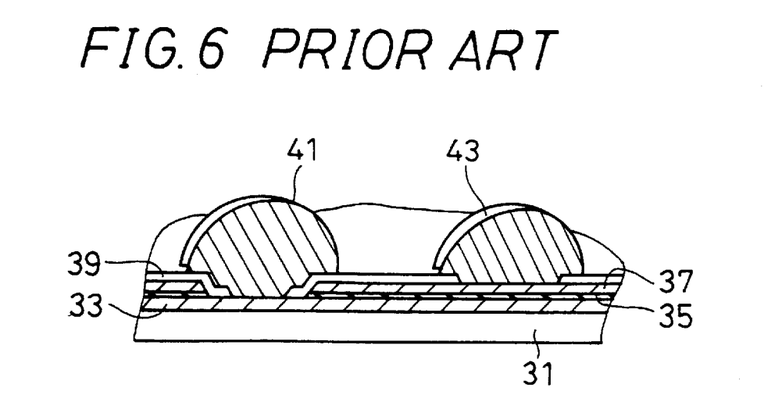
FIG. 6 is a schematic sectional view showing a conventional thin-film electronic component.

FIG. 6 shows the capacitor disclosed in this publication. On a supporting substrate 31, a lower electrode 33, an insulation layer 35, an upper electrode 37, and a protective layer 39 are stacked on top of one another. The lower electrode 33 is connected to an external terminal 41 via a through hole formed in the protective layer 39. The upper electrode 37 is connected to an external terminal 43 via a through hole formed in the protective layer 39. The external terminal 43 is formed on the insulation layer 35.

However, the above-described thin-film capacitor has the following disadvantage. In this construction, the insulation layer 35 is formed on the lower electrode 33 by a sputtering method, an evaporation method, or a sol-gel method. Since the lower electrode 33 is subjected to a high-temperature process, the adhesion strength between the supporting substrate 31 and the lower electrode 33 tends to be deteriorated. Therefore, when the external terminals 41 and 43, made of solder bumps, are coupled to the electrode disposed on a base, being fixed via the lower electrode 33 to the supporting substrate 31, the external terminals 41 and 43 tend to be stripped from the supporting substrate 31. This makes it impossible to attain adequate coupling strength between the thin-film capacitor and the base, with the result that the thin-film capacitor easily falls off due to some shock.

That is, the solder-bump external terminals 41 and 43 disposed via the lower electrode 33 on the supporting substrate 31 are put under unduly heavy load, and, when stripped off, breakage does not occur in the solder bump but occurs, for example, at the interface between the supporting substrate 31 and the lower electrode 33. Thus, it is impossible to make the most of the strength of the external terminal, i.e. solder bump, resulting in deterioration in the mounting reliability.

To overcome such an inconvenience, an adherent layer may be provided between the supporting substrate 31 and the lower electrode 33. In this case, however, the adherent layer is diffused or shifted due to the above-stated high-temperature process, and thus a desired function cannot be attained. As a result, the adhesion strength between the supporting substrate 31 and the lower electrode 33 is deteriorated.

SUMMARY OF THE INVENTION

An object of the invention is to provide a thin-film electronic component and a motherboard in which an external terminal is coupled to a supporting substrate with improved coupling strength.

The invention provides a thin-film electronic component comprising:
 a supporting substrate;
 a lower electrode formed on part of the supporting substrate;
 an insulation layer formed on the lower electrode;
 an upper electrode formed on the insulation layer;
 a connection electrode formed on part of the supporting substrate located on a bottom surface of a through hole formed in the insulation layer, the connection electrode being electrically connected to the lower electrode; and
 an external terminal disposed on the connection electrode within the through hole.

That is, the thin-film electronic component includes: a supporting substrate; a lower electrode formed on the supporting substrate; an insulation layer formed on the lower electrode; an upper electrode formed on the insulation layer; a connection electrode which is formed on a bottom surface of a through hole formed on the insulation layer and electrically connected to the lower electrode; and an external terminal disposed on the connection electrode within the through hole. In this construction, the connection electrode is disposed on the supporting substrate via a portion remaining free of the lower electrode. In other words, the inside of the through hole formed in the insulation layer serves as a region free of the insulation layer (insulation layer-free region), and the connection electrode provided within the insulation layer-free region is disposed on the supporting substrate via the portion free of the lower electrode.

Adopting such a structure confers the following advantages. Even if the insulation layer is formed by the sputtering, evaporation, or sol-gel method and the lower electrode is subjected to a high-temperature process, since the connection electrode is fabricated and disposed on the supporting substrate after completion of the formation of the insulation layer, it is possible to attain adequate coupling strength between the supporting substrate and the connection electrode disposed directly, or via an adherent layer, on the supporting substrate. This helps increase the coupling strength between the supporting substrate and the external terminal electrically connected via the connection electrode to the lower electrode, thereby improving the mounting reliability.

In the thin-film electronic component of the invention, it is preferable that the connection electrode and the lower electrode are superposed on each other at an inner periphery of the bottom surface of the through hole. This arrangement ensures that the connection electrode and the lower electrode are electrically connected to each other.

In the thin-film electronic component of the invention, it is preferable that an area of a region where the connection electrode and the lower electrode are mutually superposed is set to fall in a range of 1 to 10% of a cross-sectional area of the through hole. This arrangement helps improve the coupling strength of the external terminal to the supporting substrate and ensures that the connection electrode is electrically connected to the lower electrode.

The motherboard embodying the invention is designed to have the above-described thin-film electronic component mounted on the surface of its base via the external terminal. In this motherboard, sufficiently high coupling strength can be ensured between the external terminal and the supporting substrate, thereby improving the coupling strength between the base and the thin-film electronic component which is coupled via the external terminal to the base.

The invention further provides a thin-film electronic component comprising:

a supporting substrate;

a lower electrode formed on the supporting substrate;

an insulation layer formed on the lower electrode;

an upper electrode formed on the insulation layer;

a connection electrode electrically connected to the lower electrode;

an external terminal electrically connected to the connection electrode; and the insulation layer having a first through hole so as for the lower electrode to be exposed;

wherein the lower electrode exposed through the first through hole has a second though hole so as for the supporting substrate to be exposed, and wherein the connection electrode is so formed as to make contact with the supporting substrate exposed through the second through hole and the lower electrode exposed through the first through hole.

According to the invention, since the connection electrode, which is formed after formation of the insulation layer, is disposed directly on the supporting substrate, without the lower electrode interposed therebetween that has undergone a high-temperature process, it never occurs that the adhesion strength between the connection electrode and the supporting substrate is deteriorated. Therefore, satisfactory adhesion strength can be secured in the solder-bump external terminal disposed on the supporting substrate via, for example, a solder adherent layer, a solid barrier layer, and the connection or upper electrode. This makes it possible to make the most of the strength of the external terminal.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Hereinafter, preferred embodiments of the invention will be described in detail with reference to the accompanying drawings.

Figure 1:
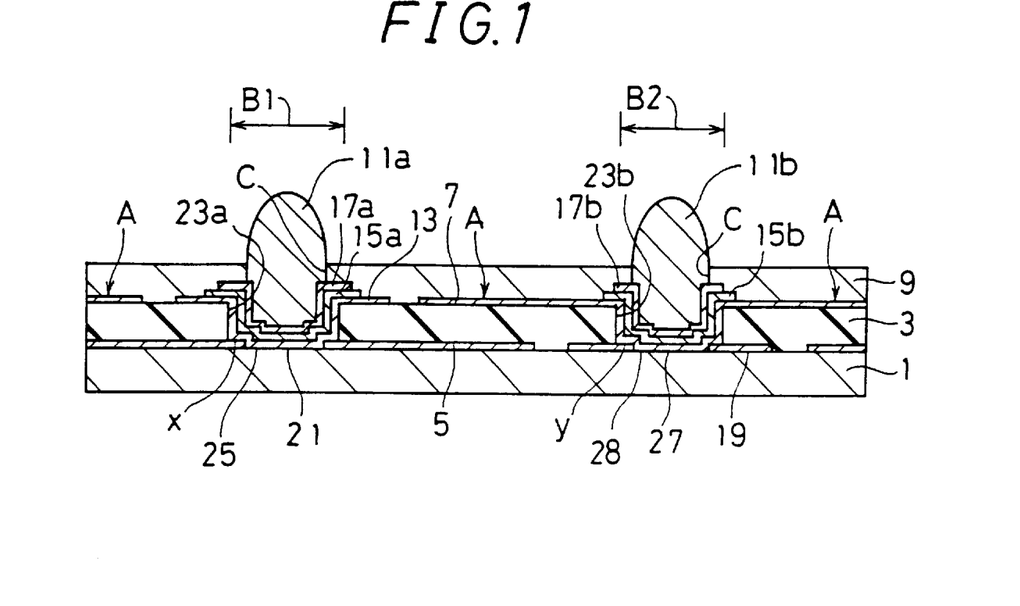
FIG. 1 is a schematic sectional view showing one embodiment of the thin-film electronic component according to the invention.

FIG. 1 is a schematic sectional view showing one embodiment of the thin-film electronic component, realized as a thin-film capacitor, according to the invention. As shown in FIG. 1, the thin-film capacitor is fabricated by forming on part of a supporting substrate 1 a plurality of thin-film elements A having insulation layers 3 (dielectric thin films), a lower electrode 5, an upper electrode 7. The lower electrode 5 and the upper electrode 7 are made of Au, and the insulation layer 3 is sandwiched between part of the lower electrode 5 and part of the upper electrode 7. The thin-film element A (capacitance element) is constructed in that way.

In this construction, there exist regions where neither thin-film element A nor insulation layer 3 is formed (a first and a second insulation layer-free region B1 and B2). Part of each of these regions is covered with a protective layer 9. Through this protective layer 9, a solder-bump external terminal 11a and a solder-bump external terminal 11b protrude. The external terminal 11a is electrically connected to the lower electrode 5 for constituting the thin-film element A, and the external terminal 11b is electrically connected to the upper electrode 7.

Connected electrically to the lower electrode 5 is a connection electrode 13 which is formed so as to extend over the top surface of the insulation layer 3 and the first insulation layer-free region B1. On the top surface of the connection electrode 13 is formed a solder barrier layer 15a. On the top surface of the solder barrier layer 15a is formed a solder adherent layer 17a in which the external terminal 11a is formed. In this arrangement, the external terminal 11a is electrically connected via the connection electrode 13 to the lower electrode 5.

The first insulation layer-free region B1, in which the external terminal 11a is formed, equates to inner part of a through hole 23a drilled in the insulation layer 3. The connection electrode 13 is formed so as to extend over part of the top surface of the insulation layer 3 and the bottom surface of the through hole 23 in succession.

Note that, although being formed concurrently, the connection electrode 13 and the upper electrode 7 are insulated from each other by creating an annular metal layer-free portion around the external terminal 11a.

A metal layer 19 is formed concurrently with the lower electrode 5. Connected electrically to this metal layer 19 is the upper electrode 7 which is so formed as to extend over the top surface of the insulation layer 3 and the second insulation layer-free region B2. A solder barrier layer 15b is formed so as to extend over the second insulation layer-free region B2 and its neighboring top surface of the upper electrode 7. On the top surface of the solder barrier layer 15b is formed a solder adherent layer 17b in which the external terminal 11b is formed. In this arrangement, the external terminal 11b is electrically connected via the upper electrode 7 to the metal layer 19.

The second insulation layer-free region B2, in which the external terminal 11b is formed, equates to inner part of a through hole 23b drilled in the insulation layer 3. Part of the upper electrode 7 is located on the bottom surface of the through hole 23b.

Note that, although being formed concurrently, the metal layer 19 and the lower electrode 5 are insulated from each other by creating an annular metal layer-free portion around the external terminal 11b.

Figure 2:
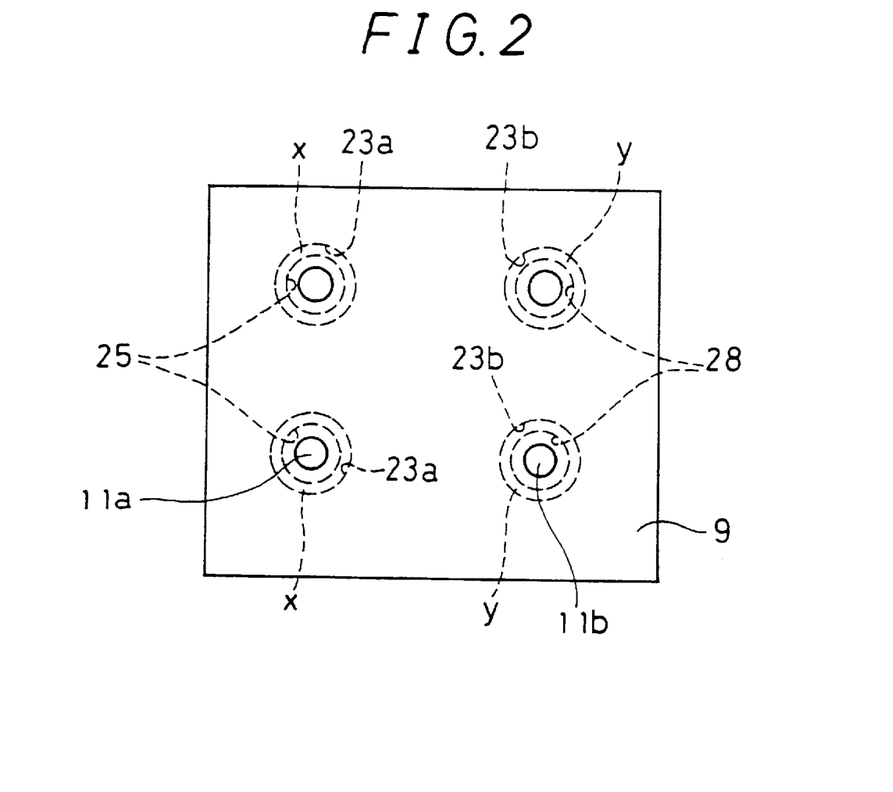
FIG. 2 is a side view of assistance in explaining the connection electrode and the lower electrode kept in a superposed state and the upper electrode and the metal layer kept in a superposed state.

In the invention, the connection electrode 13, which is formed on the bottom surface of the through hole 23a, is disposed on the supporting substrate 1 via a region 21 free of the lower electrode 5. As shown in FIG. 2, the first and second insulation layer-free regions B1 and B2 are defined by the circular-section through holes 23a and 23b drilled in the insulation layer 3, respectively. By providing the lower electrode 5 with a through hole 25 which is smaller in diameter than the through hole 23a, and by forming the connection electrode 13 within the through hole 25 of the lower electrode 5, the connection electrode 13 is brought into contact with the supporting substrate 1. Moreover, at the inner periphery of the first insulation layer-free region B1, i.e. at the inner periphery of the bottom surface of the through hole 23a, the connection electrode 13 and the lower electrode 5 are superposed on each other. The superposed region is indicated by symbol x in FIGS. 1 and 2.

In the first insulation layer-free region B1, the area of the region where the connection electrode 13 and the lower electrode 5 are mutually superposed is set to a range of 1 to 10% of the area of the first insulation layer-free region B1 (cross sectional area of the through hole 23a).

The upper electrode 7, provided within the second insulation layer-free region B2, is disposed on the supporting substrate 1 via a region 27 free of the metal layer 19. Also in this case, as shown in FIG. 2, the second insulation layer-free region B2 is defined by the circular-section through hole 23b drilled in the insulation layer 3. By providing the metal layer 19 with a through hole 28 which is smaller in diameter than the through hole 23b, and by forming the upper electrode 7 within the through hole 28 of the metal layer 19, the upper electrode 7 is brought into contact with the supporting substrate 1. Moreover, at the inner periphery of the insulation layer-free region B2, the upper electrode 7 and the metal layer 19 are superposed on each other. The superposed region is indicated by symbol y in FIGS. 1 and 2.

The insulation layer 3 is formed over substantially the entire surface of the supporting substrate 1 excluding the first and second insulation layer-free regions B1 and B2. The lower electrode 5 and the metal layer 19 are formed over substantially the entire surface of the supporting substrate 1 excluding the through holes 25, 28 and circularly-etched portions. The upper electrode 7 and the connection electrode 13 are formed over substantially the entire surface of the supporting substrate 1 excluding circularly-etched portions.

In the second insulation layer-free region B2, the area of the region where the upper electrode 7 and the metal layer 19 are mutually superposed is set to a range of 1 to 10% of the area of the second insulation layer-free region B2.

If the upper limit of 10% is exceeded, the contact area between the supporting substrate 1 and the connection and upper electrodes 13 and 7 is decreased. In this case, since the adhesion strength between the supporting substrate 1 and the lower electrode 5 or the metal layer 19 has been deteriorated due to the high temperature process, it is impossible to secure adequate adhesion strength between the supporting substrate 1 and the external terminals 11a, 11b. By contrast, if the lower limit of 1% is exceeded, the superposed area between the connection electrode 13 and the lower electrode 5, as well as that between the metal layer 19 and the upper electrode 7, is decreased, and thus there occurs partial electrical connection failure among the electrodes. This might lead to deterioration in the electrical characteristics of the thin-film electronic component. For these reasons, the superposed area between the connection electrode 13 and the lower electrode 5, as well as that between the metal layer 19 and the upper electrode 7, is set to a range of 1 to 10% of the sectional area of the through hole 23a, 23b.

Although there is no particular limitation, the insulation layer 3 for constituting a dielectric thin film of the thin-film element A is preferably formed by using a dielectric material made of perovskite type composite oxide crystals having a high relative dielectric constant in the high-frequency regions. The examples thereof include: $Pb(Mg, Nb)O_3$; $Pb(Mg, Nb)O_3$—$PbTiO_3$; $Pb(Zr, Ti)O_3$; $Pb(Mg, Nb)O_3$—$Pb(Zr, Ti)O_3$; $(Pb, La)ZrTiO_3$; $BaTiO_3$; and $(Sr, Ba)Ti O_3$. Alternatively, it is possible to use compounds obtained by providing the above exemplified materials with additives, or by substituting them.

To obtain higher capacity and excellent insulation property, the film thickness of the insulation layer 3 should preferably be set to a range of 0.3 to 1.0 $\mu$m, more preferably, a range of 0.4 to 0.8 $\mu$m. If the thickness is less than 0.3 $\mu$m, it is impossible to obtain satisfactory coatability, and thus the insulation property tends to be degraded. If the thickness is greater than 1.0 $\mu$m, the capacity tends to be decreased.

The film thickness of each of the Au made upper and lower electrodes 7 and 5, the connection electrode 13, and the metal layer 19 should preferably be set to a range of 0.3 to 0.5 $\mu$m in consideration of the impedance characteristics in the high-frequency region and the coatability of the film. If the upper and lower electrodes 7 and 5, the connection electrode 13, and the metal layer 19 each have a thickness of less than 0.3 μm, some part might remain uncoated. If the thickness exceeds 0.5 μm, the resistance possessed by the conductor layer changes little in view of the skin effect of the conductor in the high-frequency region.

Although there is no particular limitation, a material used for the supporting substrate 1 is preferably selected from alumina, sapphire, aluminum nitride, single crystal of MgO, single crystal of $SrTiO_3$, surface-oxidized silicon, glass, quartz, or the like.

It is essential only that the solder barrier layers 15a and 15b are made of Ti, Cr, Ni, Cu, Pd, Pt, or an alloy of two or more of those components, and formable by sputtering, evaporation, or plating. The solder barrier layer 15a, 15b needs to have a thickness of 0.3 μm or above to function as solder barriers.

The solder adherent layer 17a, 17b should preferably be made of a material exhibiting excellent solder wettability, such as Ni—Cr or Au. Au is particularly desirable. Moreover, in order to improve the adhesion of the colder barrier layer 15a, 15b to the Au connection and upper electrodes 13 and 7, there may be provided therebetween known adherent materials, such as Ti or Cr.

The protective layer 9 is provided for the purpose of protecting the surface of the thin-film capacitor. As preferred materials therefor, $Si_3N_4$, $SiO_2$, polyimide resin, BCB (benzocyclobutene), or the like may be used.

The solder-bump external terminal 11a, 11b should preferably be composed of a combination of at least two or more kinds of metals selected from Pb, Sn, Ag, In, Cu, Bi, Sb, and Zn. It is possible to select metal materials having mutually different melting points and eutectic temperatures in accordance with the applications of the thin-film electronic component. Moreover, the external terminal 11a, 11b is fabricated by means of known techniques such as screen printing or ball mounter. Although, in FIG. 1, the external terminal 11a, 11b is depicted such that its sizes is outwardly no different than the thickness of the insulation layer 3, in reality, the external terminal 11a, 11b is far larger in size than the thickness of the insulation layer 3.

In the thin-film capacitor embodying the invention, on the top surface of the supporting substrate 1 is formed an Au film by a DC sputtering method. Then, by using photolithography, a through hole 25 is formed in a position where the external terminal 11a is formed, a circular through hole is formed around a position where the external terminal 11b is formed, and a through hole 28 is formed inside the through hole 23b of the insulation layer 3. The through hole 28 is smaller in diameter than the through hole 23.

For example, a solution of $Pb(Mg_{1/3}Nb_{2/3})O_3$—$PbTiO_3$—$PbZrO_3$ synthesized by the sol-gel method is applied by a pin-coating method onto the supporting substrate 1. Then, drying, heat-treatment, and firing are successively conducted to form an insulation layer 3. Thereafter, by using photolithography, a through hole 23a is formed in part of the insulation layer 3 serving as the first insulation layer-free region B1, so that part of the lower electrode 5 is exposed and the through hole 25 is located at the center of the through hole 23a. Likewise, by using photolithography, a through hole 23b is formed in part of the insulation layer 3 serving as the second insulation layer-free region B2, so that part of the metal layer 19 is exposed and the through hole 28 is located at the center of the through hole 23b.

After an Au film is formed so as to cover the top surface of the insulation layer 3 and the first and second insulation layer-free regions B1 and B2, by using photolithography, the upper electrode 7 and the connection electrode 13 are formed thereon. On the surface of the connection electrode 13 are formed the solder barrier layer 15a and the solder adherent layer 17a. Likewise, on the surface of the upper electrode 7 are formed the solder barrier layer 15b and the solder adherent layer 17b.

Subsequently, application of photosensitive BCB, light exposure, and development are conducted to form the protective layer 9 having a through hole C through which the solder adherent layer 17 is exposed.

Lastly, through a step of screen printing, for example, eutectic solder paste made of Pb and Sn is transferred onto the processed solder adherent layer 17, followed by reflow soldering, whereby the solder-bump external terminals 11a and 11b are fabricated. Eventually, the thin-film capacitor embodying the invention is realized.

In the thin-film capacitor thus constructed, the connection electrode 13 and the upper electrode 7, which are formed after the formation of the insulation layer 3, are disposed directly, or via the adherent layer constituting part of the connection electrode 13 and the upper electrode 7, on the supporting substrates 1. With this arrangement, the connection electrode 13 and the upper electrode 7 are unaffected by the high-temperature process required for the formation of the insulation layer 3, and thus no deterioration occurs in the adhesion between the supporting substrate 1 and the connection and upper electrodes 13 and 7. This makes it possible to make the most of the strength of the solder-bump external terminals 11a and 11b which are respectively disposed on the supporting substrate 1 via the connection electrode 13 with the solder adherent layer 17a and the solder barrier layer 15a, and the upper electrode 7 with the solder adherent layer 17b and the solder barrier layer 15b, so that the mounting reliability improves.

In the invention, the upper and lower electrodes 7 and 5 are each made of Au which has a low resistance, is resistant to oxidizing under high-temperature conditions; and exhibits small reactivity with dielectric materials. However, to improve the adhesion of the electrodes to the supporting substrate 1, an adherent layer, typified by Ti or Cr, may be interposed between the supporting substrate 1 and the electrode 5, 7. In this case, the adherent layer constitutes part of the electrode 5, 7.

Although explanation has been given as to the case where the external terminal 11b is disposed on the supporting substrate 1 via the upper electrode 7 within the through hole 28 formed in the metal layer 19, the metal layer 19 does not necessarily have to be provided. Furthermore, the metal layer 19 and the upper electrode 7 do not necessarily have to be superposed on each other.

Although explanation has been given as to the case where the invention is applied to the thin-film capacitor shown in FIG. 1, the application of the invention is not limited thereto. For example, the invention may be applied to a thin-film inductor, a thin-film LC filter, a thin-film resistance, a thin-film RC filter, or a thin-film complex component formed by combining together a thin-film capacitor, a thin-film inductor, a thin-film LC filter, a thin-film resistance, and a thin-film RC filter.

Moreover, although the above-described example deals only with a single-plate thin-film capacitor in which a single insulation layer is sandwiched between electrodes, it is also possible to employ a thin-film capacitor in which a plurality of insulation layers and electrodes are alternately stacked on top of each other.

Further, while the invention has been embodied as such a thin-film electronic component as has solder-bump external terminals 11a and 11b disposed therein, it is not so limited but is susceptible of various changes and modifications without departing from the spirit and scope of the invention.

Figure 3:
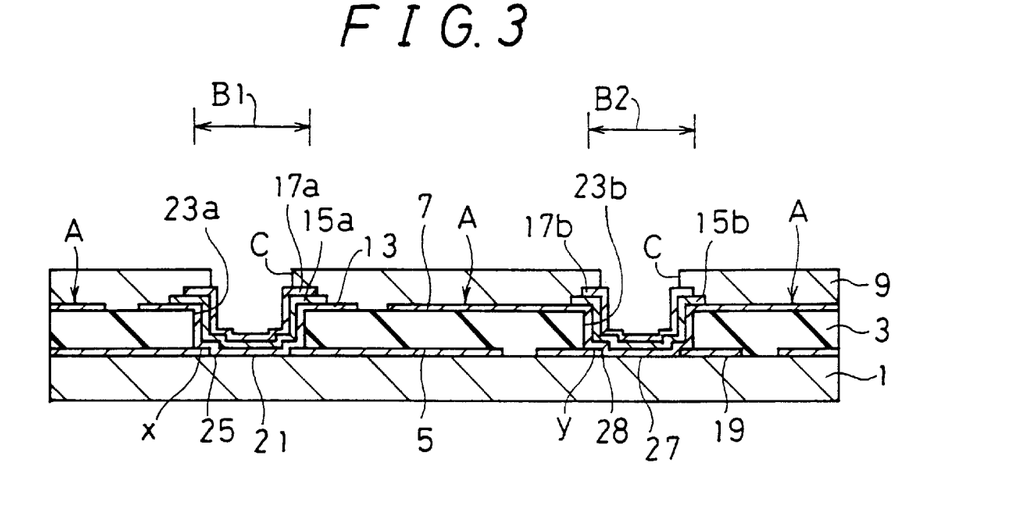
FIG. 3 is a schematic sectional view showing another embodiment of the thin-film electronic component according to the invention.

FIG. 3 is a schematic sectional view showing another embodiment of the thin-film electronic component according to the invention. As shown in FIG. 3, this construction has no solder bump. In this case, the solder adherent layers 17a and 17b, exposed within the through hole C of the protective layer 9, serve as external terminals. Note that, since the thin-film electronic component shown in FIG. 3 is constructed basically in the same manner as in FIG. 1, the only difference being the presence or absence of the solder-bump external terminal, the components that play the same or corresponding roles as in FIG. 1 will be identified with the same reference symbols.

In this embodiment, at the time of mounting the thin-film electronic component to the base, the electrodes on the surface of the base are connected to the solder adherent layer 17a, 17b by conductive members. Though there is no particular limitation, the conductive member may preferably be in the form of bumps, foils, plates, wires, paste, or varying combinations of these shapes. As materials used for the conductive member, any metal material may be used singly or in combination so long as it exhibits conductivity. The examples thereof include; Pb; Sn; Au; Cu; Pt; Pd; Ag; Al; Ni; Bi; In; Sb; and Zn. A conductive resin material may also usable.

In a case where no solder adherent layer 17a, 17b is provided, or a case where a metal layer is formed on the top surface of the solder adherent layer 17a, 17b, a layer exposed within the through hole C of the protective layer 9 serves as an external terminal.

Figure 4:
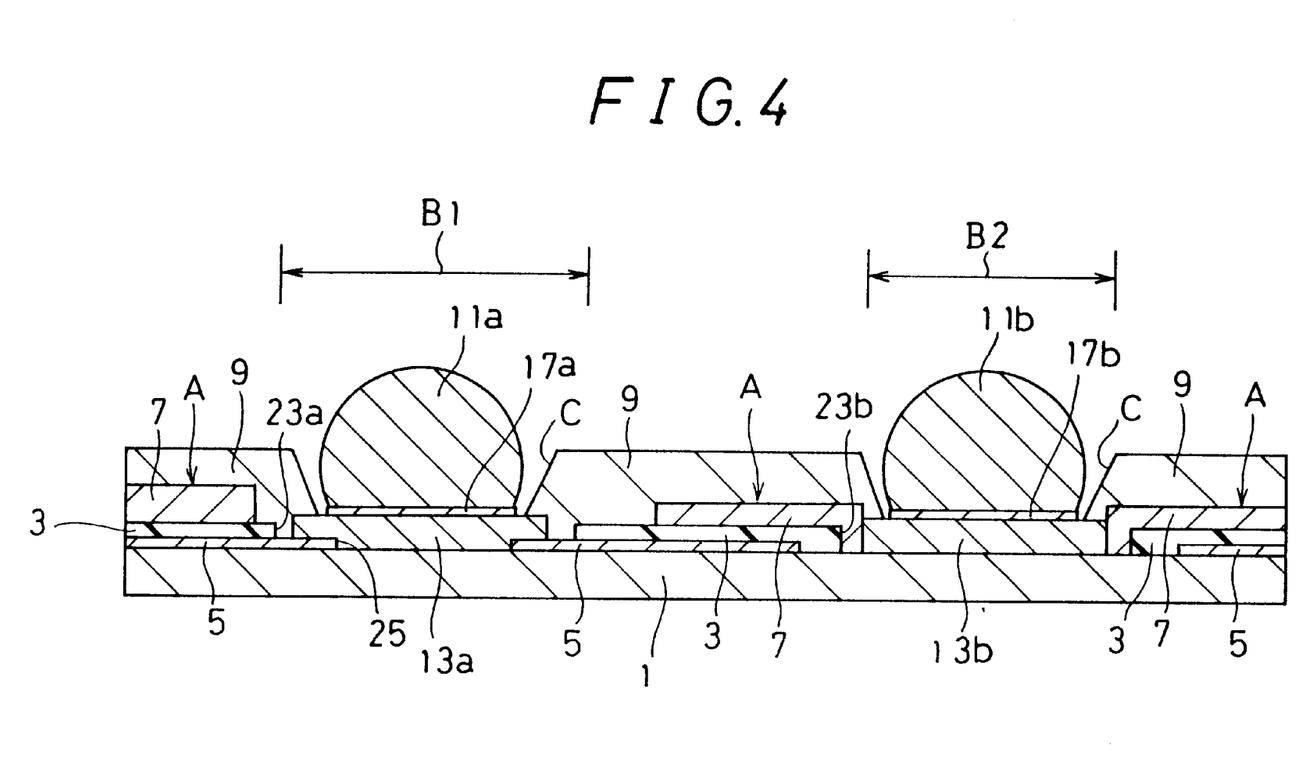
FIG. 4 is a schematic sectional view showing yet another embodiment of the thin-film electronic component according to the invention.

FIG. 4 is a schematic sectional view showing yet another embodiment of the thin-film electronic component according to the invention. In this embodiment, the components that play the same or corresponding roles as in the above-described embodiment will be identified with the same reference symbols. As shown in FIG. 4, the thin-film electronic component of the embodiment, realized as a thin-film capacitor, is fabricated by forming on part of a supporting substrate 1 a plurality of thin-film elements A having insulation layers 3 (dielectric thin films), a lower electrode 5, an upper electrode 7. The lower electrode 5 and the upper electrode 7 are made of Au, and the insulation layer 3 is sandwiched between part of the lower electrode 5 and part of the upper electrode 7. The thin-film element A (capacitance element) is constructed in that way.

Connected electrically to the lower electrode 5 is a connection electrode 13a which is formed within a region free of the insulation layer 3, namely, a first insulation layer-free region B1. On the top surface of the connection electrode 13a is formed a solder adherent layer 17a via a non-illustrated solder barrier layer. On the top surface of the solder adherent layer 17a is formed an external terminal 11a. The external terminal 11a is made of a solder bump. In this arrangement, the external terminal 11a is electrically connected via the connection electrode 13a to the lower electrode 5.

Connected electrically to the upper electrode 7 is a connection electrode 13b which is formed within a region free of the insulation layer 3, namely, a second insulation layer free region B2. On the top surface of the connection electrode 13b is formed a solder adherent layer 17b via a non-illustrated solder barrier layer. On the top surface of the solder adherent layer 17b is formed an external terminal 11b. The external terminal 11b is made of a solder bump. In this arrangement, the external terminal 11b is electrically connected via the connection electrode 13b to the upper electrode 7.

The first insulation layer-free region B1, where the external terminal 11a is formed, equates to inner part of a through hole 23a drilled in the insulation layer 3. The lower electrode 5 has a through hole 25 which is smaller in diameter than the through hole 23a. The supporting substrate 1 is exposed through the through hole 25. The connection electrode 13a is so formed as to make contact with part of the top surface of the lower electrode 5 and the bottom surface of the through hole 23a, i.e. the top surface of the supporting substrate 1. That is, the connection electrode 13a and the lower electrode 5 are superposed on each other. However, the through hole 23a of the insulation layer 3 is not contacted on its inner wail by the connection electrode 13a.

The second insulation layer-free region B2, where the external terminal 11b is formed, equates to inner part of a through hole 23b drilled in the insulation layer 3. The connection electrode 13b is so formed as to make contact with the upper electrode 7 and the bottom surface of the through hole 23b, i.e. the top surface of the supporting substrate 1. The upper electrode 7 is so formed as to extend from part of the top surface of the insulation layer 3 to the inner wall of the through hole 23b.

The thin-film element A and part of the first and second insulation layer-free regions B1 and B2 are covered with a protective layer 9. More specifically, the protective layer 9 covers part of the lower electrode 5, the insulation layer 3, and the upper electrode 7, as well as part of the connection electrode 13a, 13b. The protective layer 9 has, in several positions around its surface corresponding to the regions of the connection electrodes 13a and 13b in which the solder adherent layers 17a and 17b are formed, respectively, through holes C through which the solder adherent layers 17a and 17b are exposed. The external terminals 11a and 11b, which are formed on the solder adherent layers 17a and 17b, respectively, are so arranged as to protrude from the top surface of the protective layer 9.

The connection electrode 13a and the upper electrode 7 are insulated from each other by creating an annular metal layer-free portion around the external terminal 11a. Moreover, as described above, the connection electrode 13a is not brought into contact with the upper electrode 7 for insulation.

More specifically, the thin-film capacitor, as the thin-film electronic component, includes: the supporting substrate 1; the lower electrode 5 formed on the supporting substrate 1; the insulation layer 3 formed on the lower electrode 5; the upper electrode 7 formed on the insulation layer 3; the connection electrode 13a which is electrically connected to the lower electrode 5; and the external terminal 11a which is electrically connected to the connection electrode 13a. In the insulation layer 3 is formed the through hole 23a, acting as the first through hole, so as for the lower electrode 5 to be exposed. In the lower electrode 5, exposed through the through hole 23a, is formed the through hole 25, acting as the second through hole so as for the supporting substrate 1 to be exposed. The connection electrode 13a is so formed as to make contact with the supporting substrate 1 exposed through the through hole 25 and the lower electrode 5 exposed through the through hole 23a.

In this constriction, it is possible to achieve the same effects as achieved in the previously-described embodiment.

Although, in this embodiment, solder bumps are employed to form the external terminals 11a and 11b, the external terminals 11a and 11b may be constituted by the solder adherent layers 17a and 17b without using solder bumps. Note that, in a case where no solder adherent layer 17a, 17b is provided, or a case where a metal layer is formed on the top surfaces of the solder adherent layer 17a, 17b, a layer exposed within the through hole C of the protective layer 9 serves as the external terminal.

In this embodiment, it is preferable that the constituent elements of the thin-film capacitor are identical in material with those employed in the previously-described embodiment.

PRACTICAL EXAMPLE

Electrodes 5, 7, and 13, solder barrier layers 15a and 15b, and solder adherent layers 17a and 17b are fabricated by the DC sputtering method, and a dielectric thin film (insulation layer) is fabricated by the sol-gel method.

Firstly, on an alumina-made supporting substrate 1, a 3 nm-thick Ti adherent layer is formed. On the top surface of this adherent layer is formed a 0.3 µm-thick Au layer is formed, whereby a lower electrode 5 is fabricated that is composed of an adherent layer and an Au layer.

Secondly, by using photolithography, a lower electrode pattern is formed for constituting the thin-film capacitor, and the lower electrode 5 is subjected to the process of patterning. Thereby, an annular lower electrode-free portion (metal layer) is formed around an external terminal which is disposed on the upper electrode 7; the lower electrode 5 and the metal layer 19 are allowed to be exposed at the inner periphery of the bottom surface of the through hole 23a, 23b (installation layer-free region) of the dielectric thin film 3, which will be formed subsequently; and through holes 25 and 28 are so formed as to be concentric with the through holes 23a and 23b, respectively.

Thirdly, a solution of $Pb(Mg_{1/3}Nb_{2/3})O_3$—$PbTiO_3$—$PbZrO_3$ synthesized by the sol-gel method is applied by the spin-coating method onto the processed lower electrode 5, then dried, and heat-treated at 380° C., followed by firing at 815° C., to obtain a 0.7 µm-thick $Pb(Mg_{1/3}Nb_{2/3})O_3$—$PbTiO_3$—$PbZrO_3$ dielectric thin film 3. Thereafter, by using photolithography, through holes 23a and 23b are formed in the dielectric thin film 3. The lower electrode 5 and the metal layer 19 are exposed at the inner periphery or the bottom surface of the through hole 23a, 23b.

Fourthly, a 30 nm thick Ti adherent layer is formed so as to extend over the top surface of the dielectric thin film 3 and the inner wall and bottom surface of the through hole 23a, 23b. On this adherent layer is formed a 0.3 µm-thick Au film. The Au film and the adherent layer are then processed by photolithography to obtain an upper electrode 7 and a connection electrode 13.

Fifthly, 2.0 µm-thick Ni solder barrier layers 15a and 15b are formed, and subsequently 0.1 µm-thick Au solder adherent layers 17a and 17b are formed. These layers are then processed to have a diameter of 120 µm by photolithography.

Sixthly, application of photosensitive BCB, light exposure, and development are conducted to form a protective layer 9 having a through hole C which is about 100 µm in diameter and 4 µm in depth. Through this hole, the Au solder adherent layers 17a and 17b are exposed.

Lastly, by using screen printing, onto the processed solder adherent layer is transferred a high-temperature solder paste containing Pb in the amount of 95 wt % and Sn in the amount of 5 wt. %, followed by reflow soldering, whereby solder-bump external terminals 11a and 11b are fabricated. Eventually, such a thin-film capacitor as shown in FIG. 1 is realized.

In the thin-film capacitor thus obtained, the effective electrode area is set at 1.4 $mm^2$, and the static capacitance is set at about 40 nF at a frequency of 1 kHz.

Further, to examine the effects associated with the contact area between the connection electrode 13 and the supporting substrate 1, by changing the ratio of the superposed area between the connection electrode 13 and the lower electrode 5 to the area of the insulation layer-free region (cross sectional area of the through hole 23a, 23b), there were fabricated various thin-film capacitors having different degrees the superposed areas. These thin-film capacitors have basically the same structure as the above-described construction, the only difference being the pattern of the lower electrode 5.

In the thin-film capacitors thus obtained, the solder-bump external terminals 11a and 11b are intentionally stripped off under unduly heavy load, and the resultant breakage mode was observed. The results will be shown in FIG. 5.

Figure 5:
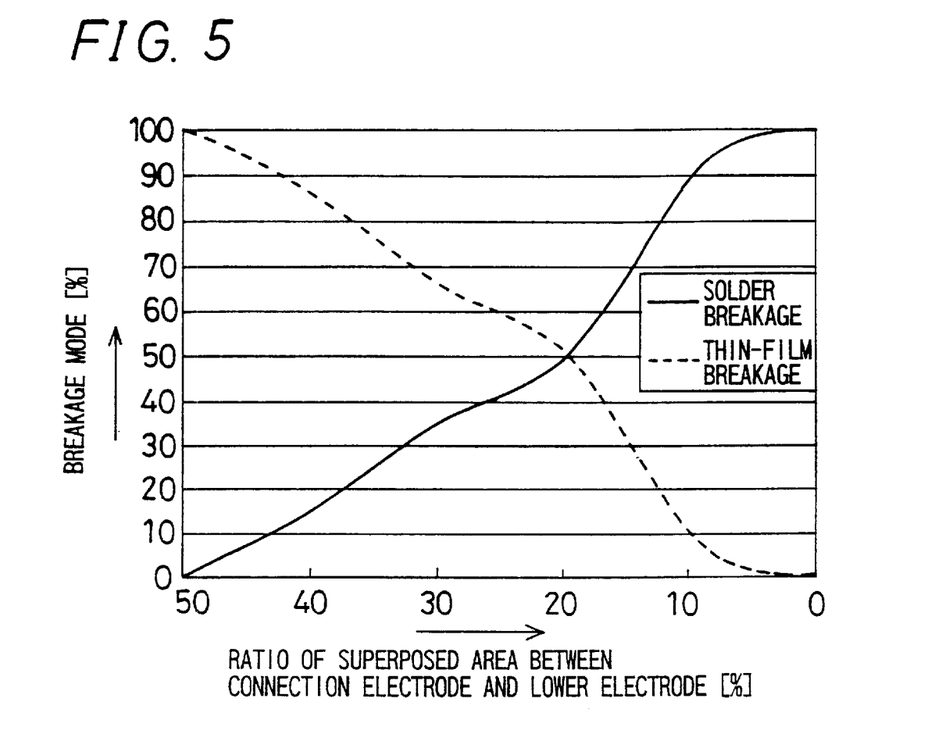
FIG. 5 is a graph showing a breakage mode ratio which varies with the ratio of the superposed area between the connection electrode and the lower electrode to the cross sectional area of the through hole.

In FIG. 5, so-called thin-film breakage is one of breakage modes and refers, for example, to breakage occurring at the interface between the supporting substrate 1 and the connection electrode 13. Similarly, so-called solder breakage refers to breakage of a solder bump per se. The solder breakage is an ideal breakage mode from the viewpoint of maximizing the strength of the solder bump. As is understood from the results shown in FIG. 5, the larger the superposed area, the greater the proportion of the thin-film breakage mode. By contrast, in the thin-film capacitors having a superposed area of equal to or less than 10%, 90 percent or more external terminals suffer from solder breakage.

Further, as a comparative example, a thin-film capacitor was prepared in which, unlike the conventional construction designed such that the lower electrode 33 within the through hole of the insulation layer 35 is provided with a through hole, a lower electrode 33 is formed on the entire bottom surface of the through hole of the insulation layer 35, and on the top surface of the lower electrode 33 is formed a connection electrode. In this example, from the fact shown in FIG. 5, it is apparent that the breakage mode is thin-film breakage. Since the lower electrode 33 is subjected to a high-temperature process, the adhesion strength between the supporting substrate 31 and the lower electrode 33 are deteriorated. Therefore, when the solder-bump external terminal 41, which is fixed via the lower electrode 33 to the supporting substrate 1, is coupled to the electrode of the base, the external terminal 41 tends to be easily stripped from the supporting substrate 31. That is, the coupling strength between the thin-film capacitor and the base (base body) is poor.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A thin-film electronic component comprising:
   a supporting substrate;
   a lower electrode formed on part of the supporting substrate;

an insulation layer formed on the lower electrode;

an upper electrode formed on the insulation layer;

a connection electrode formed on part of the supporting substrate located on a bottom surface of a through hole formed in the insulation layer, the connection electrode being electrically connected to the lower electrode; and an external terminal disposed on the connection electrode within the through hole.

2. The thin-film electronic component of claim 1, wherein the connection electrode and the lower electrode are superposed on each other at an inner periphery of the bottom surface of the through hole.

3. The thin-film electronic component of claim 2, wherein an area of a region where the connection electrode and the lower electrode are mutually superposed is set to fall in a range of 1 to 10% of a cross-sectional area of the through hole.

4. A motherboard comprising:

a thin-film electronic component; and a base, the thin-film electronic component comprising:
　a supporting substrate;
　a lower electrode formed on part of the supporting substrate;
　an insulation layer formed on the lower electrode;
　an upper electrode formed on the insulation layer;
　a connection electrode formed on part of the supporting substrate located on a bottom surface of a through hole formed in the insulation layer, the connection electrode being electrically connected to the lower electrode; and
　an external terminal disposed on the connection electrode within the through hole, the thin-film electronic component being disposed via the external terminal on a surface of the base.

5. The motherboard of claim 4, wherein the connection electrode and the lower electrode are superposed on each other at an inner periphery of the bottom surface of the through hole.

6. The motherboard of claim 5, wherein an area of a region where the connection on electrode and the lower electrode are mutually superposed is set to fall in a range of 1 to 10% of a cross-sectional area of the through hole.

7. A thin-film electronic component comprising:

a supporting substrate;

a lower electrode formed on the supporting substrate;

an insulation layer formed on the lower electrode;

an upper electrode formed on the insulation layer;

a connection electrode electrically connected to the lower electrode;

an external terminal electrically connected to the connection electrode; and the insulation layer having a first through hole so as for the lower electrode to be exposed;

wherein the lower electrode exposed through the first through hole has a second through hole so as for the supporting substrate to be exposed, and wherein the connection electrode is so formed as to make contact with the supporting substrate exposed through the second through hole and the lower electrode exposed through the first through hole.

* * * * *